United States Patent
Pedretti et al.

(10) Patent No.: US 12,277,971 B2
(45) Date of Patent: *Apr. 15, 2025

(54) COMPACT K-SAT VERIFICATION WITH TCAMS

(71) Applicant: Hewlett Packard Enterprise Development LP, Spring, TX (US)

(72) Inventors: Giacomo Pedretti, Verbania (IT); Tobias Frederic Ziegler, Spring, TX (US); Thomas Van Vaerenbergh, Diegem (BE); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,978

(22) Filed: Jan. 24, 2024

(65) Prior Publication Data
US 2024/0170064 A1    May 23, 2024

Related U.S. Application Data

(63) Continuation of application No. 17/841,532, filed on Jun. 15, 2022, now Pat. No. 11,923,009.

(51) Int. Cl.
*G11C 15/04*     (2006.01)
*H03K 19/20*    (2006.01)

(52) U.S. Cl.
CPC .......... *G11C 15/046* (2013.01); *H03K 19/20* (2013.01)

(58) Field of Classification Search
CPC ....... G11C 15/046; G11C 15/04; H03K 19/20
See application file for complete search history.

(56) References Cited

U.S. PATENT DOCUMENTS

| 7,082,044 B2 | 7/2006 | Gould et al. |
| 7,219,319 B2 | 5/2007 | Gould et al. |
| 7,602,787 B2 | 10/2009 | Cheriton |
| 8,181,258 B2 | 5/2012 | Kumar et al. |

(Continued)

FOREIGN PATENT DOCUMENTS

| CN | 101023421 A | 8/2007 |
| CN | 114091392 A | 2/2022 |
| WO | 2005/078599 A1 | 8/2005 |

OTHER PUBLICATIONS

"SATLIB—The Satisfiability Library", available online at <https://web.archive.org/web/20220120071026/https://www.cs.ubc.ca/~hoos/SATLIB/>, Jan. 20, 2022, 1 page.

(Continued)

*Primary Examiner* — Xiaochun L Chen
(74) *Attorney, Agent, or Firm* — Dickinson Wright

(57) ABSTRACT

The disclosure generally provides for a method of solving a K-SAT problem. The method comprises programming one or more clauses of a Boolean expression for a K-SAT problem written in negated disjunctive normal form (DNF) to a ternary-CAM (TCAM) array comprising columns and rows of TCAM cells, applying an interpretation comprising one or more binary variables expected to solve the Boolean expression as an input along the columns to the TCAM array, returning a binary value for each clause and updating one or more variables within the interpretation if at least one clause is violated.

20 Claims, 8 Drawing Sheets

(56) References Cited

U.S. PATENT DOCUMENTS

| | | |
|---|---|---|
| 8,990,492 B1 | 3/2015 | Zhou et al. |
| 9,087,585 B2 | 7/2015 | Bosshart |
| 9,224,091 B2 | 12/2015 | Arsovski |
| 9,577,932 B2 | 2/2017 | Ravipati et al. |
| 9,824,756 B2 | 11/2017 | Brand et al. |
| 10,127,983 B1 | 11/2018 | Peterson et al. |
| 10,846,296 B2 | 11/2020 | Strachan et al. |
| 2006/0120137 A1 | 6/2006 | Gould et al. |
| 2013/0246698 A1 | 9/2013 | Estan et al. |
| 2019/0332708 A1 | 10/2019 | Strachan et al. |
| 2022/0375536 A1* | 11/2022 | Strachan .............. G11C 15/046 |

OTHER PUBLICATIONS

Wikipedia, "De Morgan's laws", available online at <https://en.wikipedia.org/w/index.php?title=De_Morgan%27s_laws&oldid=1124497701>, Nov. 29, 2022, 10 pages.

Wikipedia, "Boolean satisfiability problem", available online at <https://en.wikipedia.org/w/index.php?title=Boolean_satisfiability_problem&oldid=1064634994>, Jan. 9, 2022, 26 pages.

Weaver et al., "Satisfiability-based Set Membership Filters", Journal onSatisfiability, Boolean Modeling and Computation 8 (2014), pp. 129-148.

Wikipedia, "Content-addressable memory", available online at <https://en.wikipedia.org/w/index.php?title=Content-addressable>, May 30, 2022, 5 pages.

Wikipedia, "WalkSAT", available online at <https://en.wikipedia.org/w/index.php?title=WalkSAT&oldid=920765094>, Oct. 11, 2019, 2 pages.

\* cited by examiner

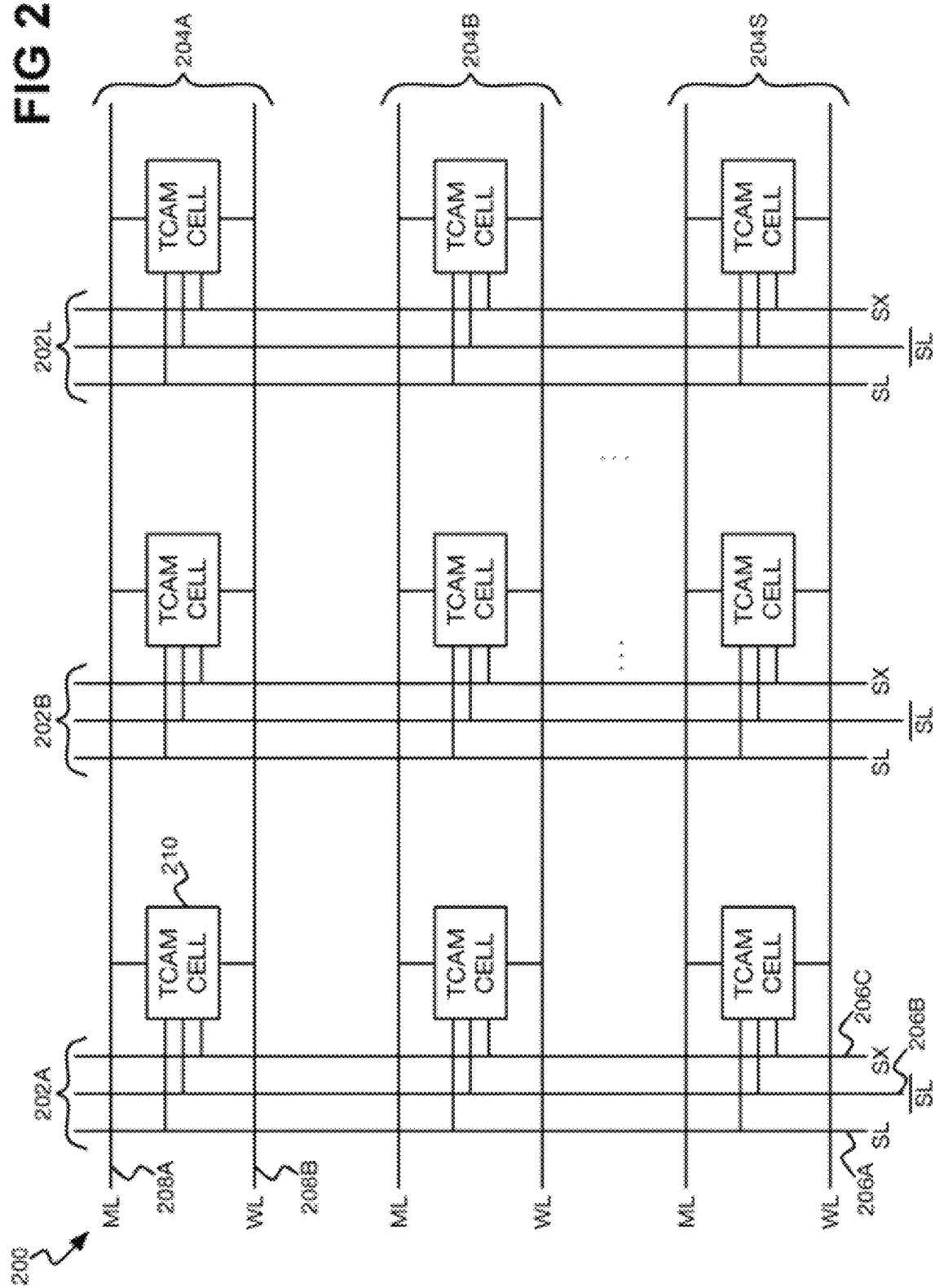

COMPACT K-SAT VERIFICATION WITH TCAMS

CROSS-REFERENCE TO RELATED APPLICATIONS

This application is a continuation application of and claims priority to U.S. application Ser. No. 17/841,532, filed on Jun. 15, 2022, the contents of which are hereby incorporated by reference in their entireties.

BACKGROUND

Content addressable memory ("CAM") is a type of computing memory in which the stored data is not accessed by its location but rather by its content. A word, or "tag", is input to the CAM, the CAM searches for the tag in its contents and, when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption. Recently, more efficient CAMs based on non-volatile memory technology have been used for in-memory computing in multiple applications such as pattern matching, artificial intelligence and machine learning inference.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 2 shows an example ternary content-addressable memory (TCAM) that can be used as a k-SAT verification circuit.

Figure 1:
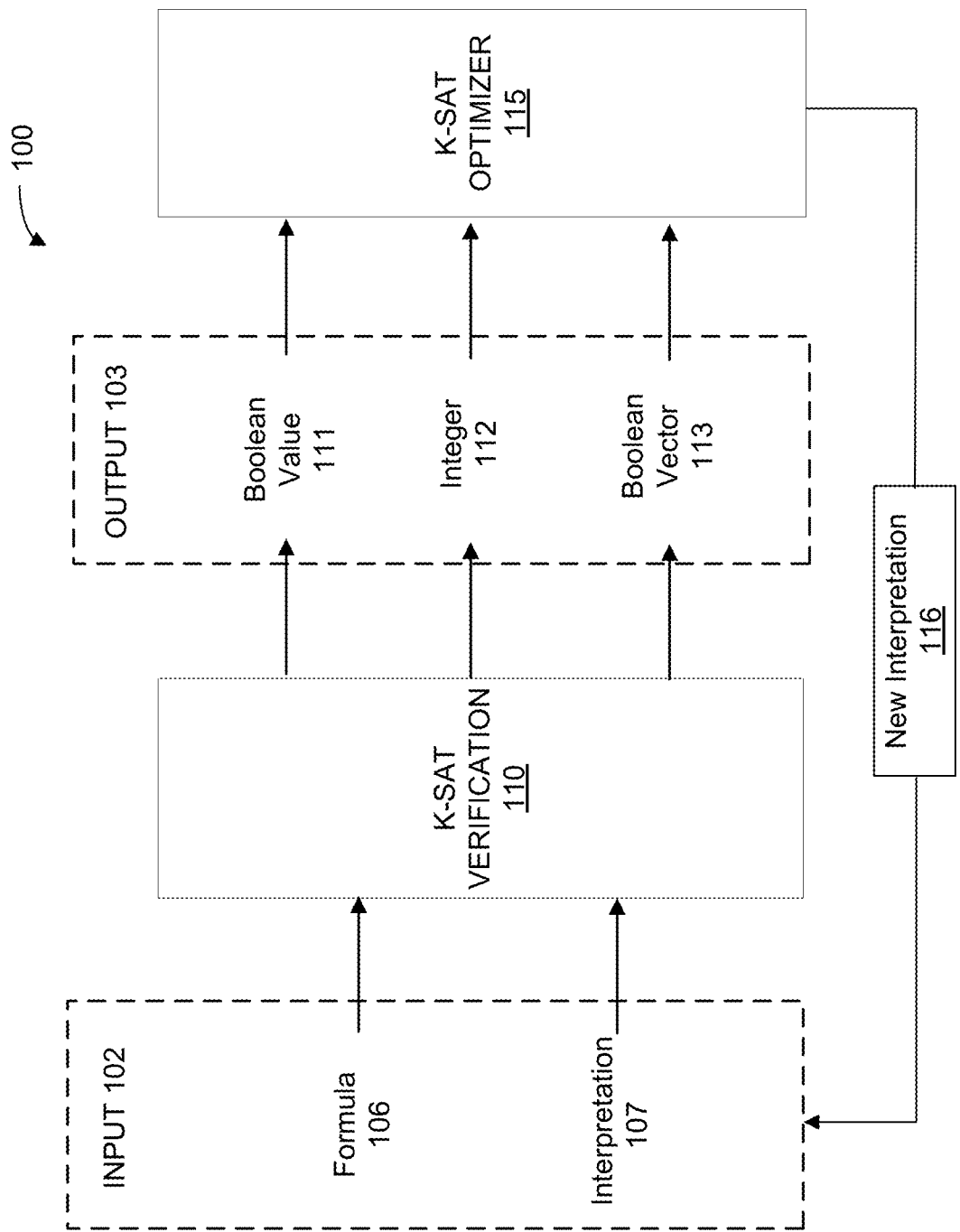
FIG. 1 shows an example of K-SAT solver including a K-SAT verification block 110.

The figures are not exhaustive and do not limit the present disclosure to the precise form disclosed.

DETAILED DESCRIPTION

Boolean satisfiability problems (i.e., propositional satisfiability problems abbreviated as Satisfiability, SAT, or B-SAT) are problems to determine whether an interpretation exists to satisfy a given Boolean formula. For example, a SAT problem attempts to determine whether the variables of a given Boolean formula can be consistently replaced by the values True or False in such a way that the formula evaluates to True. If this is the case, the formula is called satisfiable. On the other hand, if no such assignment exists, the function expressed by the formula is false for all possible variable assignments and the formula is unsatisfiable. For example, the formula "a AND NOT b" is satisfiable because the values a=True and b=False would make the formula "a AND NOT b"=True. In contrast, "a AND NOT a" is unsatisfiable. SAT is the first problem that was proved to be NP-complete. All problems in the NP-complexity class (which includes a wide range of natural decision and optimization problems) are at most as difficult to solve as SAT.

A k-SAT problem is characterized by the number of variables V, the number of literals k and the number of clauses C. A literal is either a variable or the negation of a variable. A clause is made of k literals. Conjunctive normal form, or CNF, (in particular with k=3 literals per clause) is often considered the canonical representation for SAT formulas. In CNF formation, a clause is a disjunction (logical OR operation) of literals (or a single literal). A formula is a conjunction (logical AND operation) of clauses (or a single clause). A formula can also be represented by the disjunctive normal form (DNF) where the clause is a conjunction of literals and the formula is a disjunction of the clauses.

CAMs can be implemented in technologies that permit the CAM to hold its contents even when power is lost or otherwise removed. Thus, the data stored in a CAM can persist and can act as "non-volatile memory". These technologies include, for example, resistive switching memory (i.e., memristor), phase change memory, magnetoresistive memory, ferroelectric memory, and other resistive random access memory devices, or combinations of those technologies.

CAMs can be categorized as "binary" or "ternary." A binary CAM ("BCAM") operates on an input pattern containing binary bits of zero and one. A ternary CAM ("TCAM") operates on an input pattern (and stores data) containing not only binary bits of zero and one, but also an "X" value. An "X" is sometimes referred to as a "don't care" or a "wildcard." In a search on the input pattern in a TCAM, an "X" will return a match on either a zero bit or a one bit. Thus, a search on the input pattern "10X1" will return a match for both "1001" and "1011." Note that both BCAMs and TCAMS use and operate on binary values of zero and one. CAMs are digital in that the data is stored in the CAM as binary values in a memory (e.g., SRAM, memristor, etc.) and the input patterns are represented by zeros and ones. Each memory cell in the CAM processes one value at a time (either 0/1 or 0/1/X), which limits the memory density and the power efficiency.

FIG. 1 is an example architecture of a K-SAT verification and solution technique, according to one embodiment. The example architecture 100 includes a K-SAT verification block 110 (i.e., K-SAT verification circuit), and a K-SAT optimizer 115. As seen in FIG. 1, an input 102 is applied to the K-SAT verification block 110. The input 102 includes a formula (e.g., a CNF or DNF expression) 106 comprising a plurality of clauses comprising k literals, and an interpretation (e.g., guess). The interpretation includes a set of variables that can be applied to the K-SAT problem to test/check if the variables satisfy the clauses. In one embodiment, if the variables do not satisfy each clause, the number of violated clauses can be counted. An output 103 from the K-SAT verification block 110 can include any one of: a Boolean value 111 (e.g., a value representing True or False); an integer 112; and a Boolean vector 113 of the Boolean expression. The Boolean value 111 can be used to represent if all the clauses are satisfied or not. The integer 112 can be used to represent the number of violated clauses of the interpretation. The output can also include a Boolean vector 113 which represents the index of TCAM rows where a violated clause is stored. As seen in FIG. 1, the output of the K-SAT verification block 110 is sent to and received by the K-SAT optimizer 115. The K-SAT optimizer 115 uses the output to generate a new interpretation 116 that can be applied as an input 102 to the K-SAT verification block 110 to satisfy more clauses than the previous input.

FIG. 2 shows an example ternary content-addressable memory (TCAM) 200 that can be used as k-SAT verification block 110. The TCAM 200 is programmed in correspondence with the k-SAT formula 106 so that the TCAM 200 can be used to test the interpretation 107 against the k-SAT formula 106 within the block (i.e., TCAM cell 210). The TCAM 200 is a type of content-addressable memory (CAM).

Specifically, in typical, non-CAM computer memory, such as random-access memory (RAM), the contents or data stored in the memory are looked up by memory address. By comparison, within a CAM, the memory is content addressable. To search the CAM, content is provided, instead of a memory address. A CAM may be a binary CAM, which can just match binary values, such as logic zero and logic one. By comparison, a TCAM can match and store values based on three inputs: logic zero, logic one, and a "don't care" state.

The TCAM 200 includes input column line groups 202A, 202B, ..., 202L, which are collectively referred to as the input column line groups 202. The number of column line groups 202 is equal to the number V of variables within the total set of variables $x_1, x_2, \ldots, x_V$, to which any formula 106, or interpretation 107, of FIG. 1 can be set, either identically or as a negative thereof. The column line group 202 respectively correspond to the variables $x_1, x_2, \ldots, x_L$.

The TCAM 200 includes row line pairs 204A, 204B, ..., 204S, which are collectively referred to as the row line pairs 204. The number of row line pairs 204 is equal to the number S of k-SAT clauses which compose the formula 106 in FIG. 1. The row line pairs 204 respectively correspond to the k-SAT clauses which compose a formula 106.

Each input column line group 202 includes a search line 206A, or SL, and an inverted search line 206B, or $\overline{SL}$ and can also include in some implementations of a TCAM a "don't care" line 206C, or SX. Each row line pair 204 includes a match line 208A, or ML, and a write line 208B, or WL. The lines 206A, 206B, and 206C are collectively referred to as the lines 206, and the lines 208A and 208B are collectively referred to as the lines 208.

A TCAM returns a match on a given row ML (True value) if all of the values stored in each TCAM cell on a row are equal to the value given as an input to the SL/and SL negated. Thus, the TCAM is performing a bitwise AND operation between the XNOR of each TCAM cell's stored value and its corresponding input.

Each TCAM cell 210 may be implemented by memristors, in which case the TCAM 200 is a memristor-implemented TCAM. For example, each TCAM cell 210 may be implemented by one or two memristors. An example of such a two memristor-implemented TCAM cell that uses four transistors is described in L. Huang et al., "ReRAM-based 4T2R non-volatile TCAM with a 7× NVM-stress reduction, and 4× improvement in speed word length-capacity for normally-off instant-on filter-based search engines used in big-data processing," VLSI Symposium, June 2014, pp. 99-100. An example of a one memristor-implemented TCAM that uses three transistors is described in M. Chang et al., "A 3T1R non-volatile TCAM using MLC ReRAM with sub-1 ns search time," 2015 IEEE International Solid-State Circuits Conference, 2015, pp. 1-3.

The TCAM cells 210 are programmed to correspond with the variable assignments of the k-SAT clause in formula 106. As seen in FIG. 2, the input column (i.e., input column line group 202) corresponds to the total number of V variables. Each TCAM cell 210 is disposed between corresponding input column line groups 202 and corresponding output row line pairs 204.

For example, the column line group 202B can correspond to the second variable $x_2$ of the total set of V variables $x_1, x_2, \ldots, x_V$, and thus to the variable assignment corresponding to this variable $x_2$. For example, the row line pair 204S can correspond to the last, or s-th, k-SAT clause, thus indicate if the s-th clause is satisfied or not.

In one embodiment, the TCAM cell comprises a four transistor and two memristor (4T2M) TCAM cell, with a first transistor T1 connected to a first data line SL and a second transistor T2 connected to a second data line SL. The first memristor is connected to the first transistor T1 and the second memristor M2 is connected to the second transistor T2. The first and second memristors M1, M2 are connected in series to form a resistive divider, with the output voltage of the resistive divider (i.e., voltage on common node G) being applied to the gate of a match-line transistor T4 to control whether to switch the match-line transistor T4 to pull down the voltage on match line ML. The third transistor T3 works in concert with the first transistor T1 and/or second transistor T2 for programming the memristors M1, M2. Furthermore, utilizing a TS memristor in accordance with the technology disclosed herein, the same operation is attainable with three transistors, reducing the size and power consumption of the cell.

Although discussed with respect to memristor-based example CAMS, the technology disclosed herein is not limited only to memristor-based CAMs but is directly applicable to conventional static random access memory (SRAM)-based CAMs, realized with conventional complementary metal oxide semiconductor (CMOS) technologies. Traditional SRAM-based CAM cells comprise a total of sixteen transistors comprising storage and memory circuitry. The issue of subthreshold leakage is present in any situation where a large number of transistors are present and associated with a common match line. The impact of subthreshold leakage in this environment limits the potential size of data words that can be effectively stored and searched to only 8- or 16-bits.

Given that each CAM/TCAM row performs a bitwise AND operation between the XNOR of each stored value in a CAM/TCAM and its corresponding input, k-SAT problems in a negated DNF formulation can be mapped on a CAM/TCAM. Thus, the CAM/TCAM can be used to verify which clauses are satisfied by an input interpretation.

Mapping includes programming the Boolean expression into the CAM. Specifically, each clause of a DNF Boolean expression can be mapped (e.g., programmed) into a plurality of CAM cells according to a mapping order. Thus, the inherent AND properties of the CAM can be used to help the solver solve the K-SAT problem. For example, because a negated DNF Boolean expression includes a plurality of clauses connected by an OR, each clause, comprising a plurality of literals separated by ANDs, can be mapped a row to the CAM, can be separated into a plurality of rows without disturbing the DNF Boolean expression. Once the DNF expression is mapped into rows, each variable within the row can be arranged in a column, so that a guess can be applied to each variable via each column.

Figure 3A:
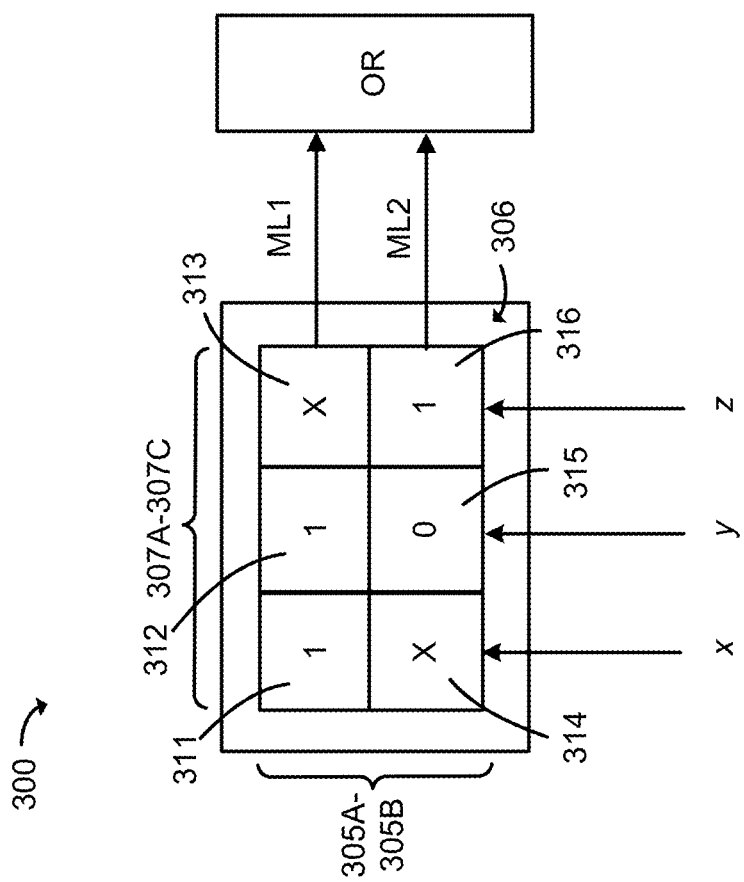
FIGS. 3A-3B illustrate an example of a 3-SAT negated DNF Boolean Expression mapped on an AND-type CAM.
Figure 3B:
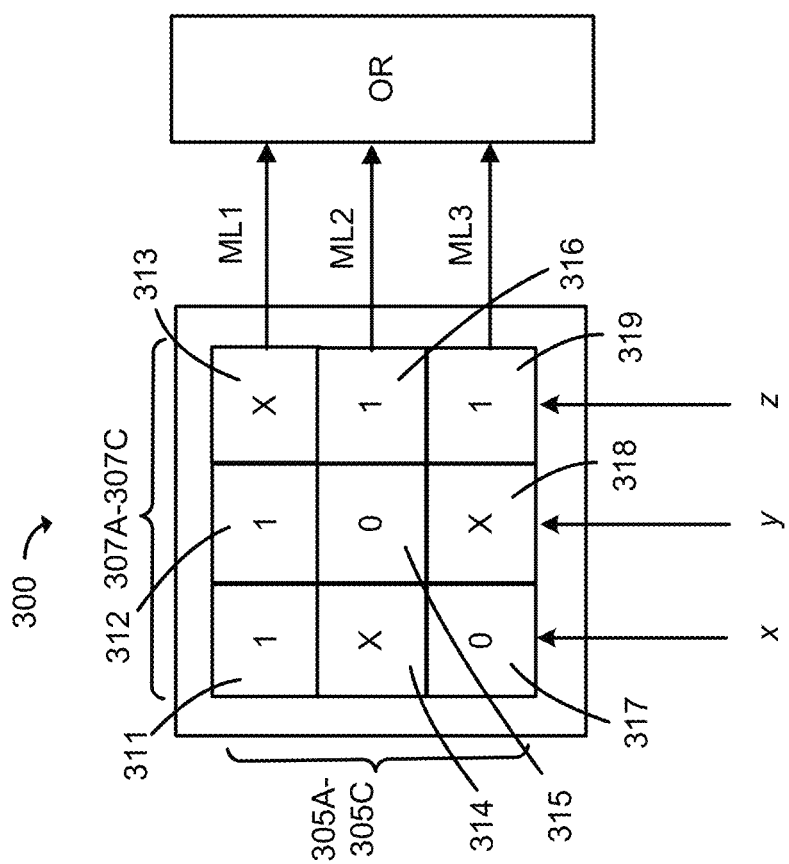

As seen in FIGS. 3A-3B, the TCAM includes a plurality of columns 307 and rows 305. Each clause of the negated DNF Boolean expression can be mapped onto a row 305 of the plurality of CAM cells 306 according to a mapping order. In one embodiment, the mapping order includes programming a first clause that includes a plurality of literals onto a first row 305A, and programming a second clause that includes a plurality of literals onto a second row 305B. Each of the plurality of literals, further include a first value assigned to each non-negated literal (e.g., z), and a second value assigned to each negated literal (e.g. ¬z).

As seen in FIG. 3A, an exemplary 2-SAT problem is mapped to a TCAM. Here, the 2-SAT problem includes two literals (i.e., k=2), three variables (i.e., V=3) and two clauses (i.e., C=2). In this example, the TCAM includes an array of cells that include two rows and three columns. Each clause is mapped to a row of the TCAM. For example, the first clause is mapped to the first row 305A, and the second clause is mapped to the second row 305B. Furthermore, each column of the TCAM includes a variable (e.g., 1, 0, or X). Each clause has k literals chosen between the V variables. In this example, each clause includes two literals. Non-negated literals are programmed as 1 in the corresponding TCAM cell and negated literals are programmed as 0 in the corresponding TCAM cell. Variables not presented in the clause are programmed as 'X' (don't care) in the corresponding TCAM cell.

For example, as seen in FIG., 3A, the expression: $\bar{f}=(x \wedge y) \vee (\neg y \wedge z)$ which represents the negated DNF of a given formula, can be programmed (i.e., mapped) onto a CAM. In this example, the first clause $(x \wedge y)$ is mapped to a first row 305A, and the second clause $(\neg y \wedge z)$ is mapped to the second row 305B. Each literal within each clause is mapped to its own respective column 307A-C. For example, x of the first and second clause is mapped to the first column 307A, y of the first and second clause is mapped to the second column 307B, and z is mapped to the third column 307C. Furthermore, as previously mentioned, each literal is assigned a bit value (ternary 0 or 1 or X) depending on whether the literal is a negated, non-negated, or absent literal not present in the clause. Here, a negated literal is assigned a bit value of 0, a non-negated literal is assigned a bit value of 1, and an absent literal is assigned a bit value of 'X' (don't care). For example, the first clause includes the literals x, y. The values of x, y are mapped to the CAM such that x is represented in cell 311 as a 1, y is represented in cell 312 as 1 and z is represented in cell 313 as a "X". As seen further in FIG. 3A, the second clause $(\neg y \wedge z)$ is mapped to the second row 305 of the CAM, such that x is represented in cell 314 as "X", ¬y is represented in cell 315 as "0" and z is represented in cell 316 as a "1". Thus, as seen in FIG. 3A, the first clause $(x \wedge y)$ of the negated DNF Boolean expression $\bar{f}=(x \wedge y) \vee (\neg y \wedge z)$ is represented as 1 1 X in the first row, and the second clause $(\neg y \wedge z)$ is represented as X 0 1 in the second row.

As seen further in FIG. 3A, each row includes a match line (ML). For example, the cells 311-313 in the first row 305A include a first ML, and the cells 314-316 in the second row 305B include a second ML.

The solver applies each variable of the interpretation (i.e., input) to each column in parallel to determine which clause is satisfied. A satisfied clause corresponds to a ML output equal to 0. For example, as seen in FIG. 3A, if the interpretation [1 1 0] is applied as input then ML1 would return a ML high value (e.g., a high order bit value 1). Here, ML1 would return a ML high value because each variable of the interpretation (i.e., input values) matched the values stored in cell 311, 312 and 313 respectively. In addition, ML2 would return a ML low value (e.g., low order bit value 0) since the interpretation [1 1 0] mismatched the values stored in cells 314, 315 and 316. Thus, the first clause is not satisfied, while the second is satisfied. In addition, in another example, if the interpretation [0 0 0] is applied as input, ML1 and ML2 would return a ML low value (e.g., a low order bit value 0), since interpretation mismatched the value stored in cells 311, 312, 313, 314, 315 and 316. Since both MLs (ML1 and ML2) return a low value, both clauses are satisfied.

A complete truth table (i.e., Truth Table 1) for the Boolean expression of FIG. 3A is shown below. A given k-SAT problem is solved when $\bar{f}=0$ ($f=1$). To verify that the ML of each row can be coupled to an OR gate to verify if the Boolean expression is satisfied. As seen in FIG. 3B, the OR gate can accommodate any number of MLs. For example, if three clauses are mapped to three rows of a CAM, then three MLs would be coupled to an OR gate.

| Truth Table 1 | | | | | | |
|---|---|---|---|---|---|---|
| x | y | z | f | $\bar{f}$ | ML1 | ML2 |
| 0 | 0 | 0 | 1 | 0 | 0 | 0 |
| 0 | 0 | 1 | 0 | 1 | 0 | 1 |
| 0 | 1 | 0 | 1 | 0 | 0 | 0 |
| 0 | 1 | 1 | 1 | 0 | 0 | 0 |
| 1 | 0 | 0 | 1 | 0 | 0 | 0 |
| 1 | 0 | 1 | 0 | 1 | 0 | 1 |
| 1 | 1 | 0 | 0 | 1 | 1 | 0 |
| 1 | 1 | 1 | 0 | 1 | 1 | 0 |

In an alternative embodiment, analog values of each ML are passed through an analog adder. The analog adder combines the analog values (i.e., non-binary signals) of each ML to calculate a sum value. The sum of the analog values is returned as an output (e.g., output 103) that can be used to by the K-SAT optimizer 115 to solve the K-SAT problem.

FIG. 3B is an example of three clauses mapped to a CAM. As previously mentioned, each clause is mapped to a row, and each literal within each clause is mapped to a column. For example, if the interpretation [0 1 1] is applied at the input to the CAM mapped with a first clause $(x \wedge y)$, a second clause $(\neg y \wedge z)$ and a third clause $(\neg x \wedge z)$ ML1 and ML2 would both return a low output, while ML3 would return a high output. Since ML3 returned a high output, the third clause is not satisfied.

For example, as seen in FIG. 3B, if the interpretation [0 0 1] is applied as an input then ML1 would return a ML low value (e.g., a low order bit value 0) since the interpretation [0 0 1] mismatched the values stored in cells 311, 312 and 313. Here, ML2 and ML3 would both return a ML high value because each variable of the interpretation (i.e., input values) matched the values stored in cell 314, 315, 316, 317, 318, and 319 respectively. Thus, in this example, the first clause is satisfied, while the second and third are not. A complete truth table (i.e., Truth Table 2) for the Boolean expression of FIG. 3B is shown below.

| Truth Table 2 | | | | | | | |
|---|---|---|---|---|---|---|---|
| x | y | z | f | $\bar{f}$ | ML1 | ML2 | ML3 |
| 0 | 0 | 0 | 1 | 0 | 0 | 0 | 0 |
| 0 | 0 | 1 | 0 | 1 | 0 | 1 | 1 |
| 0 | 1 | 0 | 1 | 0 | 0 | 0 | 0 |
| 0 | 1 | 1 | 0 | 1 | 0 | 0 | 1 |

-continued

Truth Table 2

| x | y | z | f | f̄ | ML1 | ML2 | ML3 |
|---|---|---|---|---|-----|-----|-----|
| 1 | 0 | 0 | 1 | 0 | 0 | 0 | 0 |
| 1 | 0 | 1 | 0 | 1 | 0 | 1 | 0 |
| 1 | 1 | 0 | 0 | 1 | 1 | 0 | 0 |
| 1 | 1 | 1 | 0 | 1 | 1 | 0 | 0 |

Figure 4:
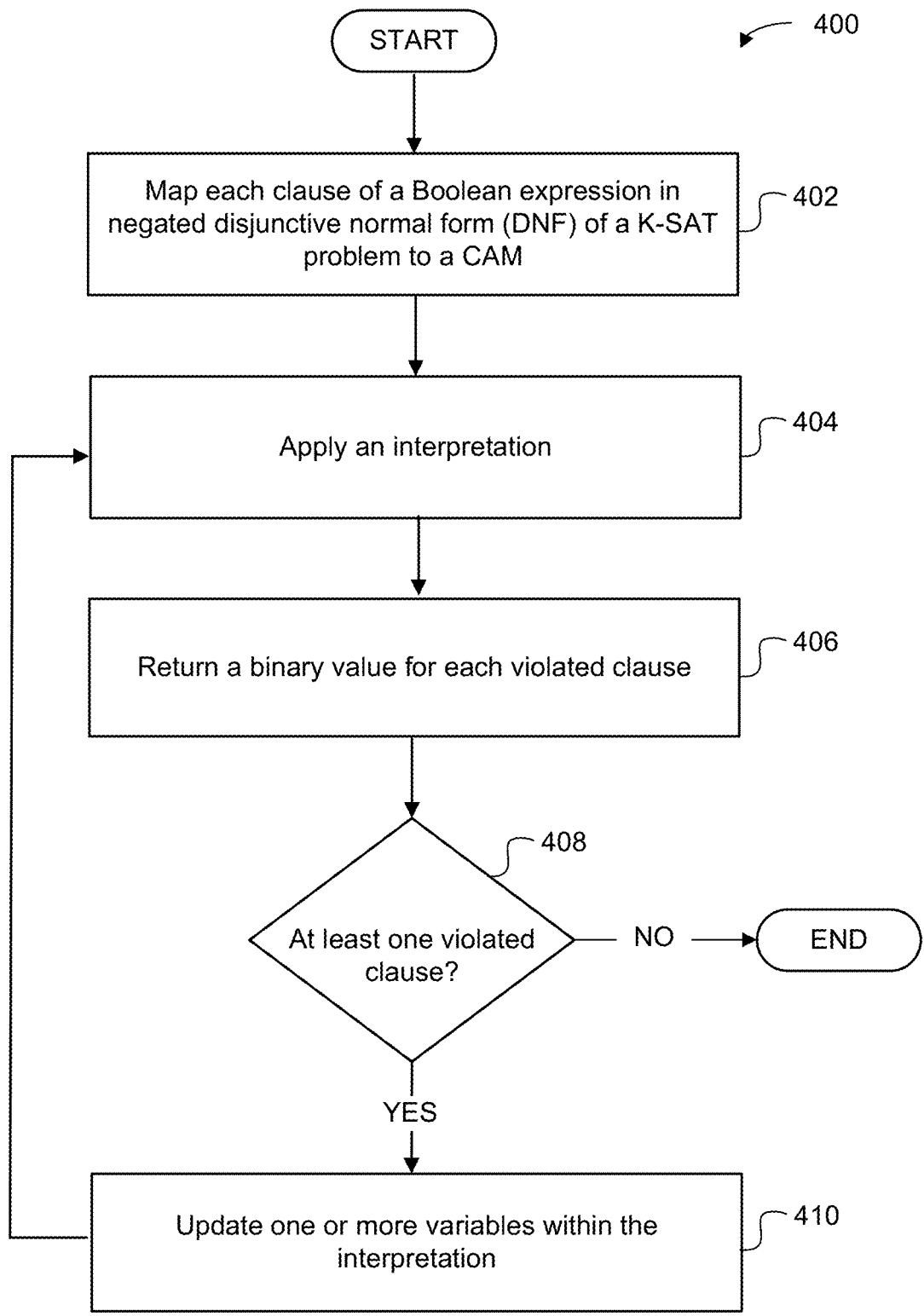
FIG. 4 is a method of solving a K-SAT problem using a CAM, according to one embodiment.

FIG. 4 is a method 400 solving a K-SAT problem using a CAM, according to one example. The method includes, programming one or more clauses of a Boolean expression for a K-SAT problem, written in negated disjunctive normal form (DNF), to a ternary-CAM (TCAM) array comprising columns and rows of TCAM cells, applying an interpretation comprising one or more binary variables expected to solve the Boolean expression as an input along the columns to the TCAM array, returning a binary value for each clause, and updating one or more variables within the interpretation if at least one clause is violated.

At activity 402, the method 400 includes programming one or more clauses of a Boolean expression for a K-SAT problem written in disjunctive normal form (DNF), to the TCAM array comprising columns and rows of TCAM cells, wherein each clause of the Boolean expression is programmed to a respective cell of a row of the TCAM array, and wherein each occurring variable of each clause is mapped to a respective TCAM cell of the row, and wherein each non-occurring variable is programmed as a don't care value.

In one embodiment, the Boolean expression can be programmed (i.e., mapped) to a four transistor, two memristor ternary-CAM (i.e., 4T2M TCAM). In another embodiment, the Boolean expression can be programmed to a two transistor, two memristor ternary-CAM (i.e. 2T2M TCAM). In yet another embodiment, the Boolean expression can be programmed to a three transistors, one memristor ternary CAM (i.e. 3T1M TCAM). In yet another embodiment, the Boolean expression can be programmed to a six transistor, two memristor analog CAM (i.e., 6T2M aCAM). In yet another embodiment, the Boolean expression can be programmed to a 2 Ferroelectric FET multibit CAM (2FeFET mCAM). In yet another embodiment, the Boolean expression can be programmed to a three terminal aCAM, and 16 transistor TCAM (i.e., SRAM). Embodiments of the disclosure can further include additional CAM configurations not previously listed. For example, embodiments can further include SRAM versions of CAM circuits. Thus, embodiments of the disclosure should not be limited to only include the CAM configurations mentioned above as embodiments can include additional memory technology not previously mentioned.

Here each clause of the one or more clauses of the Boolean expression is programmed to a respective row of the CAM. Each occurring variable to each clause is programmed to a respective TCAM cell of the row. Each non-occurring variable is programmed as a don't care value. Programming each clause of the Boolean expression for the K-SAT problem written in disjunctive normal form (DNF) includes programming a bit value that includes a 0, 1, or X to each cell within each TCAM array, wherein the X represents a don't care value. Each negation of each literal in each clause is assigned a bit value of 0, each non-negation of each literal in each clause is assigned a bit value of 1, and each absent variable in each clause is assigned a bit value of X.

At activity 404, the method 400 includes applying an interpretation 107 comprising one or more binary values expected to solve the Boolean expression as an input along the columns to the TCAM array. The interpretation includes one or more binary variables expected to solve the binary expression. As previously mentioned, the interpretation is applied as an input along the columns of the TCAM array to determine whether one or more clauses are satisfied. A satisfied clause corresponds to a ML output equal to 0. A violated clause (i.e., a non-satisfied clause) corresponds to a ML output equal to 1. The one or more binary variables can be applied to the K-SAT problem to test/check if the variables satisfy at least one clause. For example, in one embodiment, the interpretation can include a guess applied as an input along the columns of the TCAM array to determine whether one or more clauses are satisfied. As previously mentioned, Boolean satisfiability problems (i.e., propositional satisfiability problems abbreviated as Satisfiability, SAT, or B-SAT) are problems to determine whether an interpretation exists to satisfy a given Boolean formula. Thus, the TCAM can be used to verify which clauses are satisfied by an interpretation.

At activity 406, the method 400 includes returning a binary value for each violated clause. As previously mentioned, each row of cells in the CAM is connected to a respective match line (ML). In one embodiment, if an interpretation matches the values stored in each row, the ML of that row will return a value associated with a true condition (e.g., ML returns TRUE, or a high bit value 1). If an interpretation mismatches the values stored in each row, the ML of that row will return a value associated with a false condition (e.g., ML returns FALSE, or a low bit value 0). For example, if all of the values stored in each TCAM cell on a row are equal to the value given as an interpretation (i.e., input) to the SL/and SL negated then the TCAM will return a match on a given row's ML (True value). Thus, the TCAM is performing a bitwise AND operation between the XNOR of each TCAM cell's stored value and its corresponding input.

In one embodiment, if the variables do not satisfy all of the clauses, the number of violated clauses can be counted. An output 103 from the K-SAT verification block 110 can include any one of: a Boolean value 111 (e.g., a value representing True or False); an integer 112; and Boolean vector (e.g. a vector where each entries represent True or False) 113. The Boolean value 111 can be used to represent if the clause is satisfied or not. The integer 112 can be used to represent the total number of violated clauses. The Boolean vector 113 can be used to represent the index of the violated clauses, where a True value in one of the vector entry means that the corresponding TCAM row is storing a clause which is violated. As seen in FIG. 1, the output of the K-SAT verification block 110 is sent to and received by the K-SAT optimizer 115. The K-SAT optimizer 115 uses the output to generate a new interpretation 116 that can be applied as an input 102 to the K-SAT verification block 110 to satisfy more clauses than the previous input.

At activity 408, the method 400 includes determining whether the clause is satisfied or violated. In one embodiment the K-SAT optimizer 115 uses the output 103 from the K-SAT verification block 110 to determine if the clause if satisfied or violated. If the clause is violated, the method includes proceeding to step 410 to update one or more variables within the interpretation. A violated clause corresponds to an ML output equal to 1. A satisfied clause corresponds to a ML output equal to 0. If the clause is satisfied (i.e., not violated), then the method ends.

At activity 410, the method 400 includes updating one or more variables within the interpretation if at least one clause is violated. If the clause is violated, the K-SAT optimizer 115 uses the output 103 from the K-SAT verification block to generate an updated interpretation 116 (e.g., a new interpretation) that can be applied as an input along the columns of the TCAM array to determine whether a clause is violated. The new interpretation 116 is sent from the K-SAT optimizer 115 to the K-SAT verification block 110 as an input 102. Thus, the K-SAT verification block 110 and the K-SAT optimizer 115 create a feedback loop that can be used to solve a k-SAT problem, and can thereby determine whether an interpretation exists to satisfy a given Boolean formula.

Figure 5B:
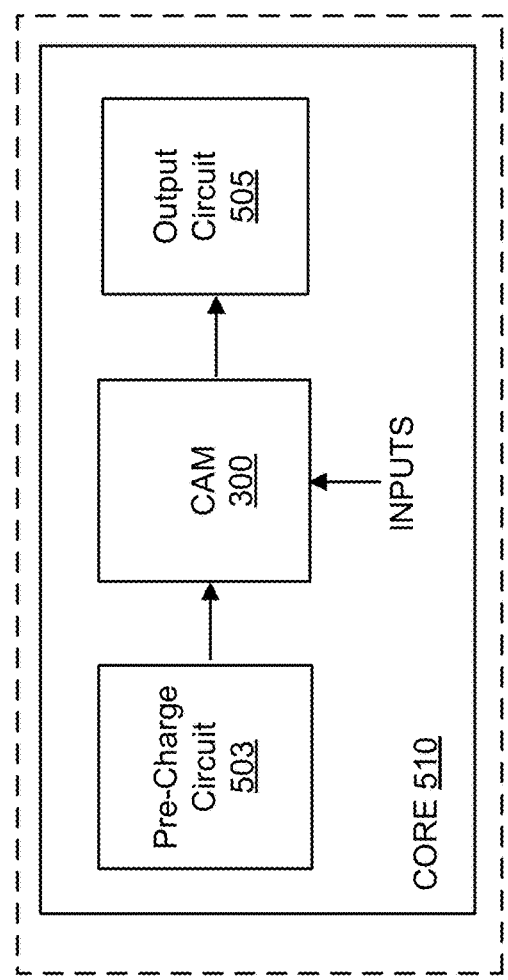
FIGS. 5A-5B illustrate an example architecture of one or more cores in a tile, according to one embodiment.
Figure 5A:
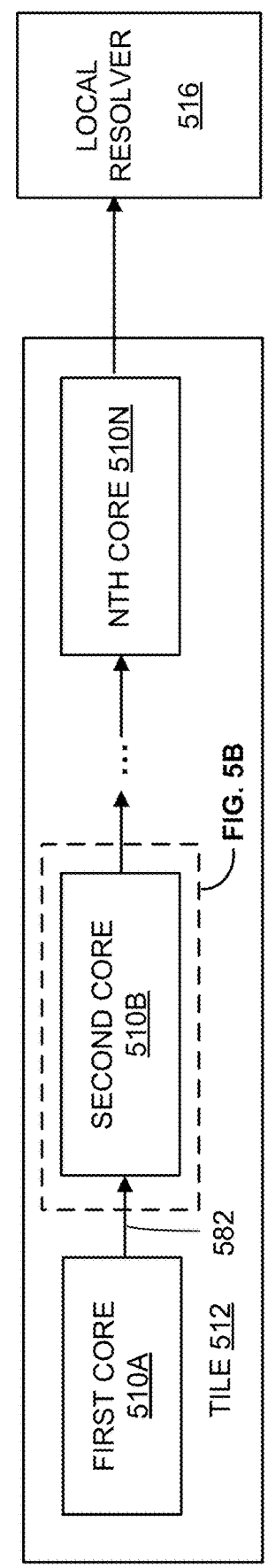

FIGS. 5A-5B illustrate an example architecture of one or more cores in a tile, according to one embodiment. Specifically, FIG. 5A illustrates an example architecture of a plurality of cores that can be used to solve the K-Sat problem. FIG. 5B illustrates an example architecture of a core circuit. In some configurations, it may be necessary to program a large K-SAT problem, with a large number of variables and a large number of clauses. However, since the size of the TCAM array is limited (e.g., the number of rows and columns in the CAM array are limited), multiple TCAMs may be utilized to program the Boolean Expression. For example, as information is propagated across a row, parasitic capacitance of each cell can result in useful information being lost over time. To prevent this, the Boolean Expression can be separated (i.e., "chunked") into smaller portions that be programmed (i.e., mapped) into a plurality of TCAMs.

Thus, since each core includes a TCAM, a portion of each Boolean expression can be programmed to each core 510. As seen in FIG. 5A, each core 510 can be communicatively coupled to a neighboring core in series via a bus (e.g., bus 582). Each core includes a pre-charge circuit 503, a CAM 300, and an output circuit 505. When an interpretation is applied to each column, the results of the interpretation are passed to the neighboring core (e.g., core 510B, 510N). The results of the interpretation from each core 510A, 510B, 510N are sent a local resolver 516, where they are aggregated. In one embodiment, the results from each core 510A, 510B, 510N are stored at the local resolver 516, and can be gathered (i.e., fetched) by the K-SAT optimizer 115. As seen in FIGS. 5A-5B, the output circuit senses the MLs of violated clauses of the interpretations (e.g., inputs) and uses the MLs of the violated clauses to pre-charge the circuit (e.g., pre-charge circuit 503) of the neighboring core (e.g., 510B, 510N). In one embodiment, data regarding the MLs of violated clauses are stored in a latching circuit (not shown). The stored data can be referenced by the pre-charging circuit 503 of the neighboring core. The pre-charging circuit 503, uses the data from the previous core 510 to charge the circuit of the neighboring core 510 with the data from the previous core 510 Thus, the operation can be performed over a larger set of variables by sequentially operating (e.g., cascading) one core 510 after another. Furthermore, in one embodiment, the multiple cores 510 can be communicatively coupled in series create a tile 512. As explained in further detail in FIG. 6, multiple tiles 605 can be communicatively coupled to a control unit (e.g., computer system 700).

Figure 6:
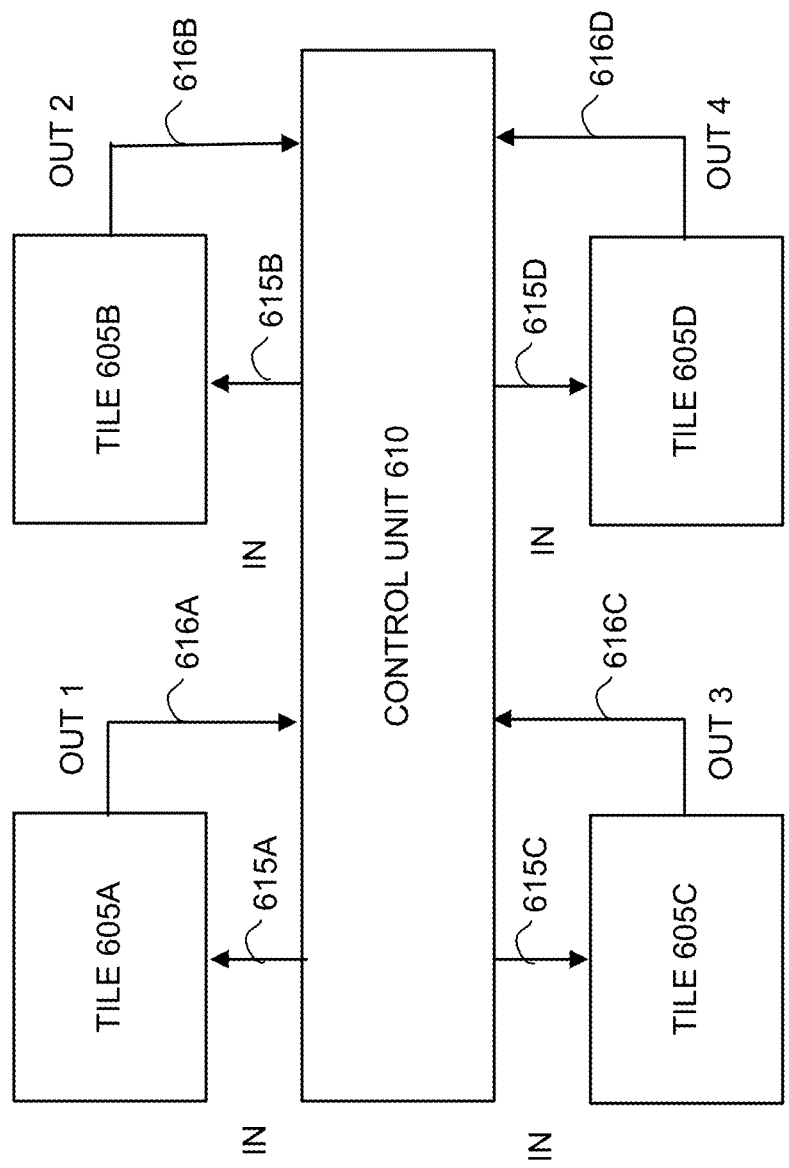
FIG. 6 illustrates an example architecture of one or more tiles, according to one embodiment.

FIG. 6 illustrates an example architecture of one or more tiles, according to one embodiment. Here, the example architecture includes a plurality of tiles 605. Each tile 605A-605D includes a plurality of cores 510. As found in FIG. 5A, each core 510 includes a pre-charge circuit 503, a CAM 300 and an output circuit 505. Here, each tile 605A-D includes an input 615A-D and an output 616A-D. Each tile is electrically coupled to a control unit 610. The control unit 610 includes the K-SAT optimizer, and computer system 700 of FIG. 7.

In this embodiment, a K-SAT problem can be assigned to each tile 605, such that a first tile 605A is assigned a first negated DNF Boolean expression, a second tile 605B is assigned a second negated DNF Boolean expression, a third tile 605C is assigned a third Boolean expression, and a fourth tile 605D is assigned a fourth Boolean expression. In an alternative embodiment, a large k-SAT problem can be divided into multiple sub-problems such that each sub-problem is assigned to a tile 605. For example a first tile 605A is assigned a first sub-problem, a second tile 605B is assigned a second sub-problem etc.

Figure 7:
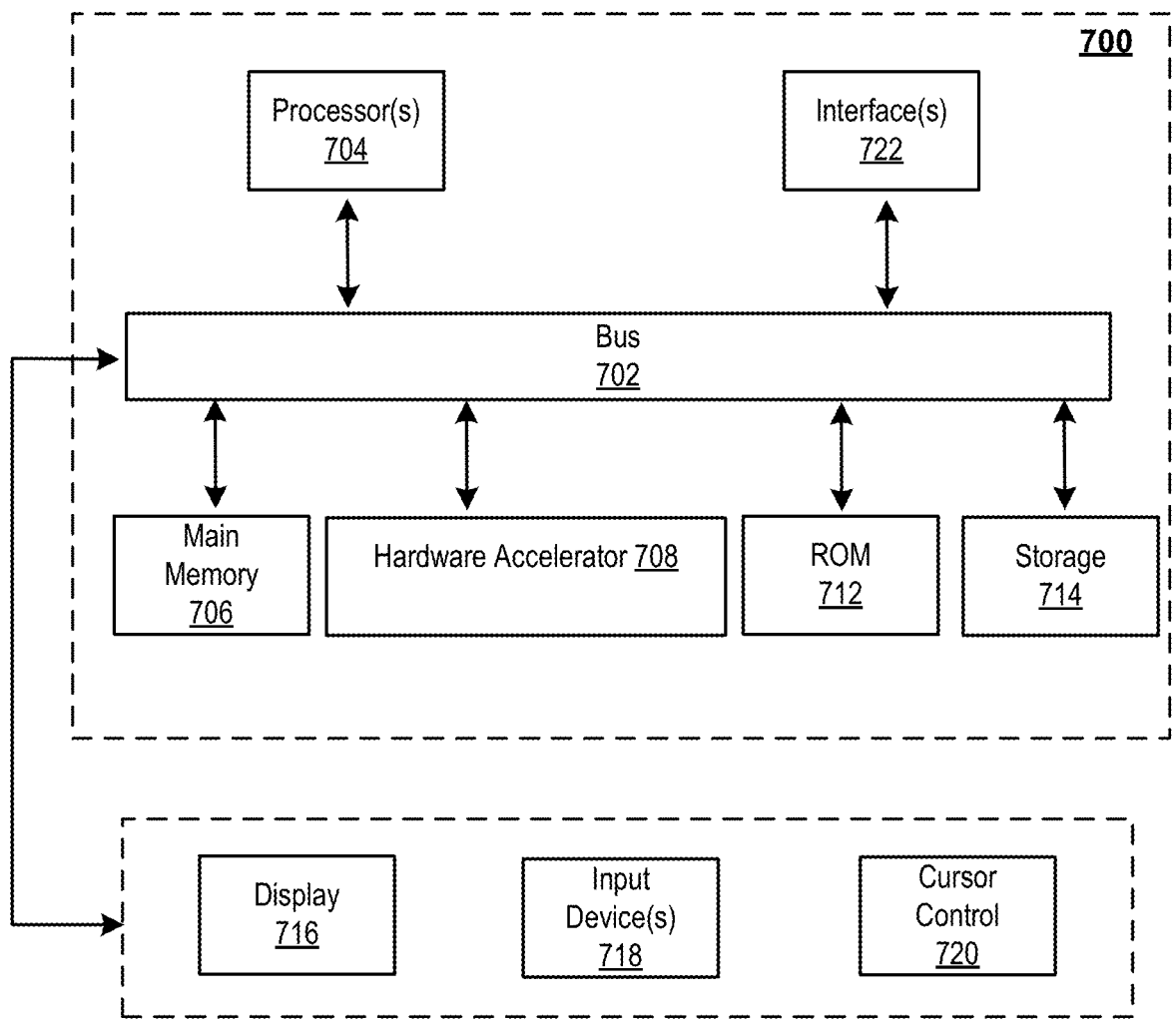
FIG. 7 is an example computing component that may be used to implement various features of example embodiments of the invention.

FIG. 7 depicts a block diagram of an example computer system 700 in which various of the embodiments described herein may be implemented. For example, in one embodiment, the k-solver can be implemented as computer system 700. The computer system 700 includes bus 702 or other communication mechanism for communicating information, one or more hardware processors 704 coupled with bus 702 for processing information. Hardware processor(s) 704 may be, for example, one or more general purpose microprocessors.

Computer system 700 also includes main memory 706, such as a random access memory (RAM), cache and/or other dynamic storage devices, coupled to bus 702 for storing information and instructions to be executed by processor 704. Main memory 706 also may be used for storing temporary variables or other intermediate information during execution of instructions to be executed by processor 704. Such instructions, when stored in storage media accessible to processor 704, render computer system 700 into a special-purpose machine that is customized to perform the operations specified in the instructions.

Computer system 700 additionally includes hardware accelerator 708. Hardware accelerator 708 may be configured to execute instructions (i.e. programming or software code) stored in the main memory 706, read-only memory (ROM) 712, and/or storage device 714 to encode a set of logical rules embodied in a data structure into the CAM. In an example implementation, the exemplary hardware accelerator 708 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 708 may be specifically optimized to perform a discrete subset of computer processing operations, or execute a discrete subset of computer-executable instructions, in an accelerated manner.

The CAM may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the CAM may be implemented using technologies that permit CAM to hold its contents even when power is lost or otherwise removed. Thus, data in the CAM "persists" and the CAM can act as what is known as a "non-volatile memory."

Computer system 700 further includes read only memory (ROM) or other static storage device coupled to bus 702 for storing static information and instructions for processor 704. Storage device 714, such as a magnetic disk, optical disk, or USB thumb drive (Flash drive), etc., is provided and coupled to bus 702 for storing information and instructions.

Computer system 700 may be coupled via bus 702 to display 716, such as a liquid crystal display (LCD) (or touch screen), for displaying information to a computer user. Input device 718, including alphanumeric and other keys, is coupled to bus 702 for communicating information and command selections to processor 704. Another type of user input device is cursor control 720, such as a mouse, a trackball, or cursor direction keys for communicating direction information and command selections to processor 704 and for controlling cursor movement on display 716. In some embodiments, the same direction information and command selections as cursor control may be implemented via receiving touches on a touch screen without a cursor.

The computing system 700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor(s) 704 executing one or more sequences of one or more instructions contained in main memory 706. Such instructions may be read into main memory 706 from another storage medium, such as storage device 714. Execution of the sequences of instructions contained in main memory 706 causes processor(s) 704 to perform the process steps described herein. In alternative embodiments, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 714. Volatile media includes dynamic memory, such as main memory 706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 702. Transmission media can also take the form of acoustic or light waves, such as those generated during radio-wave and infra-red data communications.

Computer system 700 also includes a communication interface 722 coupled to bus 702. Communication interface 722 provides a two-way data communication coupling to one or more network links that are connected to one or more local networks. For example, communication interface 722 may be an integrated services digital network (ISDN) card, cable modem, satellite modem, or a modem to provide a data communication connection to a corresponding type of telephone line. As another example, communication interface 722 may be a local area network (LAN) card to provide a data communication connection to a compatible LAN (or WAN component to communicate with a WAN). Wireless links may also be implemented. In any such implementation, communication interface 722 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 722, which carry the digital data to and from computer system 700, are example forms of transmission media.

Computer system 700 can send messages and receive data, including program code, through the network(s), network link and communication interface 722. In the Internet example, a server might transmit a requested code for an application program through the Internet, the ISP, the local network and the communication interface 722. The received code may be executed by processor 704 as it is received, and/or stored in storage device 714, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 700.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A computer system comprising:
a machine-readable storage medium storing executable instructions; and
a processor configured to execute one or more of the instructions to:
program one or more clauses of a Boolean expression for a K-SAT problem written in negated disjunctive normal form (DNF) to a ternary-CAM (TCAM) array comprising columns and rows of TCAM cells, wherein each clause of the Boolean expression is programmed to a respective row of the TCAM array, and wherein each occurring variable of each clause is mapped to a respective TCAM cell of the row, and wherein each non-occurring variable is programmed as a don't care value;
apply an interpretation comprising one or more binary variables expected to solve the Boolean expression as an input along the columns to the TCAM array;
return a binary value for each clause; and
update one or more variables within the interpretation if at least one clause is violated.

2. The computer system of claim 1, to program each clause of the Boolean expression the one or more processors are configured to execute one or more of the instructions to program a bit value that includes a 0, 1, or X to each cell within each TCAM array, wherein the X represents a don't care value.

3. The computer system of claim 2, wherein each negation of each literal in each clause is assigned a bit value of 0, each non-negation of each literal in each clause is assigned a bit value of 1, and each absent variable in each clause is assigned a bit value of X.

4. The computer system of claim 1, wherein each match line returns a high bit value if the interpretation violates the clause stored in a corresponding row of the TCAM array, and wherein each match line returns a low bit value if the interpretation satisfies the clause stored in the corresponding row of the TCAM array.

5. The computer system of claim 1, wherein the processor is configured to execute one or more of the instructions to generate an updated interpretation comprising one or more updated variables.

6. The computer system of claim 1, wherein the processor is configured to execute one or more of the instructions to apply an updated interpretation comprising updated search data.

7. The computer system of claim 1, wherein the processor is configured to execute one or more of the instructions to pre-charge each match line to a high voltage.

8. A non-transitory computer-readable medium storing a set of instructions, the set of instructions comprising:
one or more instructions that, when executed by a processor, cause the processor to:
program one or more clauses of a Boolean expression for a K-SAT problem written in negated disjunctive normal form (DNF) to a ternary-CAM (TCAM) array comprising columns and rows of TCAM cells, wherein each clause of the Boolean expression is programmed to a respective row of the TCAM array, and wherein each occurring variable of each clause is mapped to a respective TCAM cell of the row, and wherein each non-occurring variable is programmed as a don't care value;

apply a first interpretation, comprising one or more binary variables expected to solve the Boolean expression, as an input along the columns to the TCAM array;

return a binary value for each clause;

update one or more variables within the first interpretation if at least one clause of the Boolean expression is not satisfied; and apply a second interpretation, comprising one or more updated binary variables expected to solve the Boolean expression, as an input along the columns to the TCAM array.

9. The non-transitory computer-readable medium of claim 8, wherein the one or more instructions that, when executed by the processor, cause the processor to program a bit value that includes a 0, 1, or X to each cell within each TCAM array, wherein the X represents a don't care value.

10. The non-transitory computer-readable medium of claim 8, wherein the one or more instructions that, when executed by the processor, cause the processor to assign a bit value of 0 to each negation of each literal in each clause;

assign a bit value of 1 to each non-negation of each literal in each clause; and assign a bit value of X to each absent variable in each clause.

11. The non-transitory computer-readable medium of claim 8, wherein each match line returns a high bit value if the interpretation violates the clause stored in a corresponding row of the TCAM array, and wherein each match line returns a low bit value if the interpretation satisfies the clause stored in the corresponding row of the TCAM array.

12. The non-transitory computer-readable medium of claim 8, wherein the one or more instructions that, when executed by the processor, cause the processor to generate a new interpretation comprising one or more updated variables.

13. The non-transitory computer-readable medium of claim 8, wherein each variable 1, 0, and X corresponds to a different voltage applied to each search line of the TCAM array.

14. The non-transitory computer-readable medium of claim 8, wherein the one or more instructions that, when executed by the processor, cause the processor to pre-charge each match line to a high voltage.

15. The non-transitory computer-readable medium of claim 8, wherein the one or more instructions that, when executed by the processor, cause the processor to generate an updated interpretation comprising one or more updated variables.

16. A circuit for solving a K-SAT problem comprising:

a K-SAT verification circuit configured to:

program one or more clauses of a Boolean expression for a K-SAT problem written in negated disjunctive normal form (DNF) to a TCAM array comprising columns and rows of TCAM cells, wherein each clause of the Boolean expression is programmed to a respective cell of a row of the TCAM array; and apply an interpretation comprising search data to one or more search lines of the TCAM array, wherein the search data includes one or more binary variables expected to solve the Boolean expression; and discharge a match line if a row does not include the search data; and a K-SAT optimizer, configured to:

update the interpretation if at least one match line is not discharged.

17. The circuit of claim 16, wherein the search data includes a bit value that includes a 0, 1, or X to each cell within each TCAM array, wherein the X represents a don't care value.

18. The circuit of claim 17, wherein each negation of each literal in each clause is assigned a bit value of 0, each non-negation of each literal in each clause is assigned a bit value of 1, and each absent variable in each clause is assigned a bit value of X.

19. The circuit of claim 16, wherein the K-SAT verification circuit is further configured to apply an updated interpretation comprising updated search data.

20. The circuit of claim 16, wherein the K-SAT verification circuit is further configured to apply another interpretation, comprising one or more updated binary variables expected to solve the Boolean expression, as an input along the columns to the TCAM array.

* * * * *